(12) United States Patent
Sibrai et al.

(10) Patent No.: US 7,061,339 B2
(45) Date of Patent: Jun. 13, 2006

(54) ENHANCED ARCHITECTURES OF VOLTAGE-CONTROLLED OSCILLATORS WITH SINGLE INDUCTOR (VCO-1L)

(75) Inventors: Andreas Sibrai, Krottendorf (AT);
Nikolay Tchamov, Tampere (FI)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 125 days.

(21) Appl. No.: 11/007,378

(22) Filed: Dec. 8, 2004

(65) Prior Publication Data

US 2005/0104676 A1 May 19, 2005

Related U.S. Application Data

(63) Continuation of application No. 10/618,535, filed on Jul. 11, 2003, now Pat. No. 6,867,658.

(30) Foreign Application Priority Data

Jul. 7, 2003 (EP) ................... 03368069

(51) Int. Cl.
*H03B 5/04* (2006.01)
(52) U.S. Cl. ................... 331/117 R; 331/185
(58) Field of Classification Search ........... 331/185, 331/186, 117 R, 117 FE, 109, 36 C
See application file for complete search history.

(56) References Cited

U.S. PATENT DOCUMENTS

| | | | |
|---|---|---|---|
| 5,920,235 A | 7/1999 | Beards et al. | 331/108 D |
| 5,937,340 A | 8/1999 | Philippe et al. | 455/310 |
| 6,181,216 B1 | 1/2001 | Waight | 331/117 FE |
| 6,353,368 B1 | 3/2002 | Iravani | 331/57 |
| 6,486,744 B1 | 11/2002 | Cann | 331/117 D |

OTHER PUBLICATIONS

"A Fully Integrated CMOS DCS-1800 Frequency Synthesizer" by Jan Craminckx et al; IEEE Jrnl. of Solid-State Circuits, vol. 33, No. 12, Dec. 1998, pp. 2054-2065.
"Wide-Tuning-Range Dual-VCOs for Cable Modem Receivers," by Dari Stadius et al; 2002 IEEE MTT-S Digest, XP-001099558, IT-TU-53, pp. 581-584.

*Primary Examiner*—Joseph Chang
(74) *Attorney, Agent, or Firm*—George O. Saile; Stephen B. Ackerman

(57) ABSTRACT

Methods to achieve low power consumption, high output amplitude and an improved high frequency stability, and high speed for voltage-controlled oscillators are disclosed These methods includes to provide a current mirror, a power supply voltage Vdd, two single-ended outputs, a lower layer of gain providing structure comprising cross-coupled transistors, an upper layer of gain providing structure, a control voltage, a pair of capacitors to block a DC-connection to the gates of said cross-coupled transistors, a pair of resistors, and an LC-tank. Important steps of these methods include to set the time instances when said transistors of lower layer of gain providing structure open and close, to shut-down the transistors of lower layer of gain providing structure as soon as the energy required to keep the oscillations in said LC-tank is secured, to add additional gain in the amplification loop; and to pump-out charges of the channels of said transistors of said lower layer gain providing structure.

19 Claims, 6 Drawing Sheets

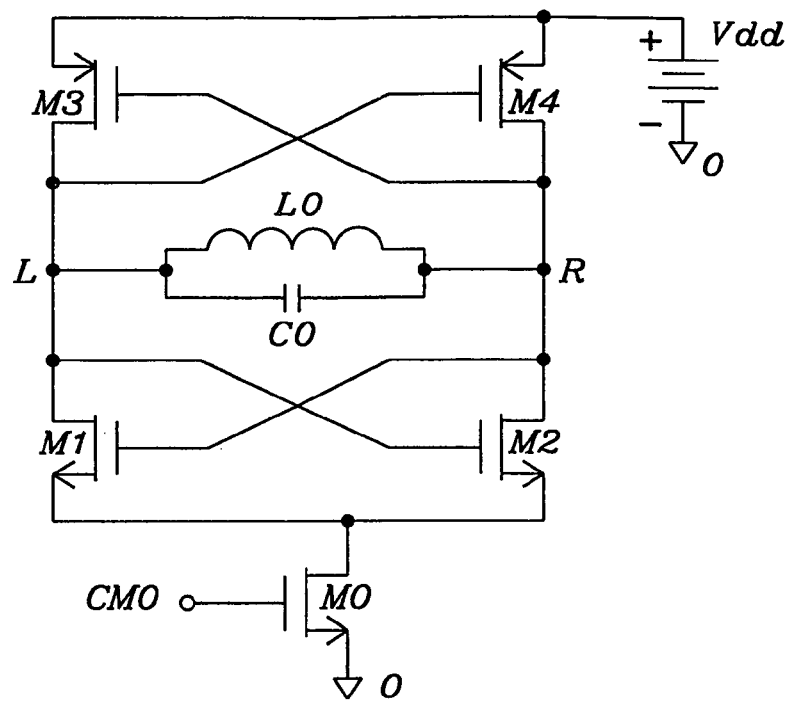
*FIG. 1 - Prior Art*
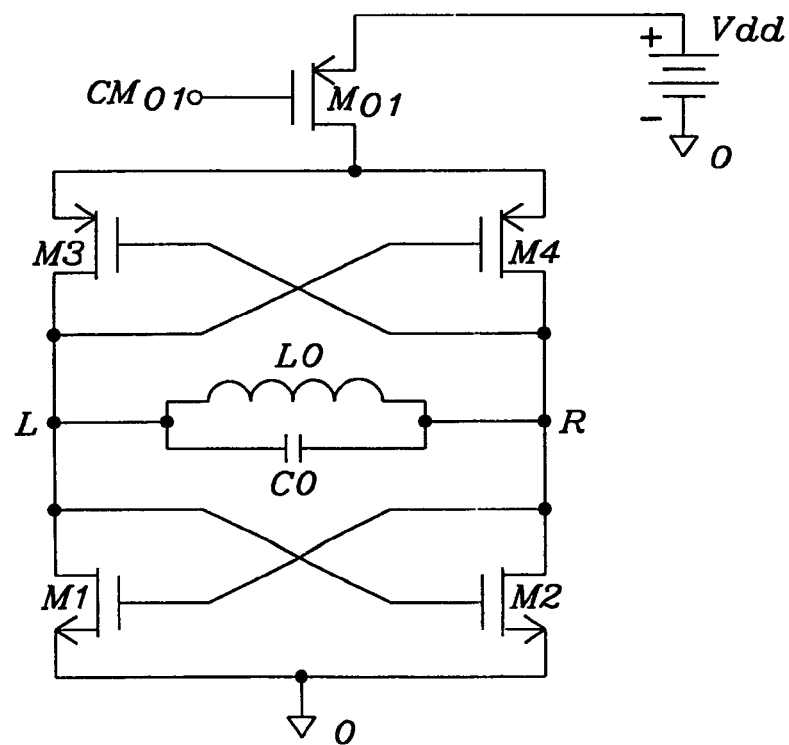
*FIG. 2 - Prior Art*

ENHANCED ARCHITECTURES OF VOLTAGE-CONTROLLED OSCILLATORS WITH SINGLE INDUCTOR (VCO-1L)

This is a continuation of patent application Ser. No. 10/618,535, filing date Jul. 11, 2003, now U.S. Pat. No. 6,867,658, Enchanced Architectures Of Voltage Controlled Oscillators With Single Inductor (Vco-1L), assigned to the same assignee as the present invention, which is herein incorporated by reference in its entirety.

BACKGROUND OF THE INVENTION (1) Field of the Invention

The invention relates to voltage controlled oscillator circuits, and more particularly, to enhanced architectures of VCOs with a single inductor (VCO-1L).

(2) Description of the Prior Art

All of today's wireless communication systems utilize voltage controlled oscillator (VCO) circuits. Among them are base stations and mobile terminals/mobile phones and current communication devices, such as radios, etc. Besides lower power consumption, higher output amplitudes, broader tuning range, and cleaner spectrum, a lower phase noise is a most important parameter. It is a major challenge for the designer of VCOs to optimize all the key parameters, especially enhanced phase noise, of a VCO.

The initial topology of a differential one-inductor VCO (VCO-1L) has been introduced in several publications and gained popularity mostly due the publication of Jan Craninckx and Michel S. J. Steyaert (A Fully Integrated CMOS DCS-1800 Frequency Synthesizer, IEEE Journal of Solid-State Circuits, Vol. 33, No. 12, December 1998, pp. 2054–2065).

The main advantages of said initial topology are related to the simple high-gain architecture, which is operational on almost any Si-process where standard quality transistors having complimentary polarity are available.

Throughout the patent applications the same markers have been used (e.g. M1, M2, M3, etc) in the drawings and correspondent in this document to signify in an architectural sense identical components of the circuits shown.

A principal schematic of said circuit is presented in FIG. 1 prior art having a N-MOS current mirror CM0 based on the N-MOS transistor M0, or, as shown in FIG. 2 prior art, with a P-MOS current mirror CM01 based on the P-MOS transistor M01. The power supply is noted by $V_{dd}$ and differential output can be taken from the single ended left-output L and right-output R. The principle of operation of both variations is similar but the performance with respect to the frequency Instability measured by phase-noise is not exactly the same.

As shown in FIG. 1 the N-MOS transistors M1 and M2 form the lower layer of the gain providing structure, while the P-MOS transistors M3 and M4 form the upper layer. The parallel resonance LC-tank L0-C0 is connected between said lower layer and said upper layer determining mainly the frequency of oscillation. Usually, but not limited to, the frequency of oscillation is controlled by some varactors which constitute the controllable part of the capacitance of the capacitor C0.

The circuit is oscillating in a cross-manner: when transistors M1 and M3 are heading toward opening up, the transistors M2 and M4 are going to a closing down.

While the current mirror CM0 of FIG. 1 prior art is built in N-MOS technology, the current mirror CM01 of FIG. 2 prior art is built using P-MOS technology. With the exception of the difference in the current mirrors CM0 resp. CM01 the structure of the circuits shown in FIG. 1 prior art and in FIG. 2 prior art is identical.

The timing of the process and indeed the stability of this timing are determined by the quality factor of the parallel resonance LC-tank formed by L0 and C0 in FIG. 1 prior art and in FIG. 2 prior art and the pick-to-pick amplitude on it. Thus, the instability of the amplitude and the frequency are caused by the other components in the circuit, which compensate the energy losses in the tank in order to keep the oscillations continuous.

The current mirrors CM0 resp. CM01 shown in FIG. 1 prior art resp. FIG. 2 prior art provide current stabilization of the total differential current throughout the circuit.

Different design strategies are applied for those two versions shown in FIG. 1 prior art and in FIG. 2 prior art of this topology, because the noise inside of the N-MOS and P-MOS transistors is different enough in nature and frequency components of said transistors, because the noise depends from the geometry and sizes of said transistors, and also because the major source of the noise in this architecture stems from the current mirrors CM0 resp. CM01. Slight preferences to the version with P-MOS mirror exist compared to the version with a N-MOS mirror.

U.S. Pat. No. 6,486,744 (to Cann) shows a low phase noise voltage-controlled oscillator (VCO) and method. The VCO comprises a negative resistance generator and a resonator that reduces VCO phase noise. In one embodiment, the VCO comprises a negative resistance generator and a resonator structure that reduces VCO phase noise. The VCO uses the reflection properties of the resonator. An advantage of one embodiment of the VCO is its relatively low cost of manufacture compared to other VCOs. Another advantage of one embodiment of the VCO is its lower phase noise compared to conventional microstrip resonators. In one embodiment, low phase noise performance is achieved by tuning the outside fingers of an interdigital filter resonator in the VCO and configuring suitable physical dimensions of the resonator. One aspect of the invention relates to a voltage-controlled oscillator comprising a resonator and a negative resistance generator. The resonator comprises a three-finger interdigital filter and a plurality of varactors. A first varactor is coupled to a first finger of the interdigital filter and a ground terminal. A second varactor is coupled to a third finger of the interdigital filter and a ground terminal. A second finger of the interdigital filter is coupled to a ground terminal. The first and second varactors are configured to alter a resonant frequency of the interdigital filter to a desired frequency in response to a tuning voltage applied to the resonator. The negative resistance generator is coupled to the resonator. The negative resistance generator is configured to receive a first signal with a particular frequency from the resonator. The negative resistance generator is configured to output a second signal with a substantially similar frequency and a higher amplitude compared to the first signal.

U.S. Pat. No. 6,353,368 (to Iravani) discloses a low phase noise CMOS voltage controlled oscillator (VCO) circuit. The VCO circuit includes a bias circuit and a VCO cell coupled to the bias circuit. The VCO cell includes a VCO output for transmitting a VCO output signal. A frequency to voltage converter is coupled to receive the VCO output signal. The frequency to voltage converter converts a frequency of the VCO output signal into a corresponding voltage output. The voltage output is coupled to control the bias circuit. The VCO cell includes a current source coupled to the bias circuit such that the voltage output from the voltage a current converter provides negative feedback to the VCO cell via the current source. The negative feedback, in turn, reduces the phase noise on the VCO output signal.

U.S. Pat. No. 6,181,216 (to Waight) discloses an oscillator using a Field-Effect Transistor (FET) in a Colpitts configuration. The circuit has a resistor from source to ground. Also connected to the source are two capacitors, one between the source and ground while the other is from source to gate. These capacitors provide a phase-shifted feedback signal to the gate. Also connected to the gate is a varactor tank, which has a voltage variable reactance that is used to tune the oscillation to the desired frequency. Between the drain of the FET and the supply voltage is a resistor-capacitor network. Between two series resistors a shunt capacitor is added to minimize local oscillator leakage onto the Vdd line. The resistor network also provides impedance for the Pre-Scalar output, which is simply a connection to the drain of the FET. The pre-scalar output is used to provide a reference signal to the phase-locked loop, which generates the correction voltage to the oscillator's VCO input. It is at the pre-scalar output that a filter network is added to reduce the base-band noise from the Vdd line. By adding a shunt network, consisting of a small inductor and a low ESR capacitor, the supply noise is filtered without reducing the voltage or current supplied to the oscillator. The inductor removes the shunt capacitance at the oscillation frequency, avoiding any reduction in signal to the phase-locked loop circuit. The low ESR capacitor works with the resistance on-chip between the Vdd line and the drain to reduce the low frequency noise present at the FET's drain. This reduction in low-frequency noise results in improved phase noise performance without degrading any other circuit parameters.

SUMMARY OF THE INVENTION

A principal object of the present invention is to achieve topologies for voltage controlled oscillators with a single inductor having a low phase noise.

A further object of the present invention is to achieve topologies for voltage controlled oscillators with a single inductor having low power consumption.

Another further object of the present invention is to achieve topologies for voltage controlled oscillators with a single inductor having abroad tuning range.

In accordance with the objectives of this invention a circuit for a voltage controlled oscillator having a timing control by a bias circuitry and having a low phase-noise has been achieved. Said circuit comprises first a first pair of transistors being of a technology, wherein complementary polarity transistors are available, wherein the base of a first transistor of said pair is connected to the drain of a second transistor of said pair and the base of a second transistor of said pair is connected to the drain of said first transistor of said pair of transistors, the sources of said transistors are connected to each other and to a Vdd voltage, and the drain of a first transistor of said first pair of transistors is connected to the drain of a first transistor of a second pair of transistors and the drain of a second transistor of said first pair of transistors is connected to the drain of a second transistor of said second pair of transistors, a power supply supplying said Vdd voltage, and a second pair of transistors being of a technology, wherein complementary polarity transistors are available, wherein the base of a first transistor of said second pair is connected via a means of a bias circuitry influencing timing control to the drain of a second transistor of said second pair and the base of a second transistor of said pair is connected via said means of a bias circuitry influencing timing control to the drain of said first transistor of said pair, each base is connected to said means of a bias circuitry influencing timing control, the sources of said pair of transistors are connected to each other and to a current source, and each drain of said transistors is connected to a means of a LC-tank. Furthermore said circuit comprises a means of a bias circuitry influencing timing control, a current mirror being connected to the sources of said second pair of transistors, a LC-tank being connected between the drains of said first pair of transistors, and a differential output comprising two ports being located at both sides of said LC-tank.

Also in accordance with the objectives of this invention a circuit for a voltage controlled oscillator having a timing control by a bias circuitry, a reduced power consumption, and a higher frequency stability and a low phase-noise has been achieved. Said circuit comprises a first pair of transistors, being of a technology wherein complementary polarity transistors are available, wherein the base of a first transistor of said pair is connected to the drain of a second transistor of said pair and the base of a second transistor of said pair is connected to the drain of said first transistor of said pair of transistors, the sources of said transistors are connected to each other and to a $V_{dd}$ voltage, and the drain of a first transistor of said first pair of transistors is connected to the drain of a first transistor of a second pair of transistors and the drain of a second transistor of said first pair of transistors is connected to the drain of a second transistor of said second pair of transistors, a power supply supplying said $V_{dd}$ voltage, and a second pair of transistors being of a technology wherein complementary polarity transistors are available, wherein the base of a first transistor of said second pair is connected via a means of a bias circuitry influencing timing control to a means to introduce additional gain and the base of a second transistor of said pair is connected via said means of a bias circuitry influencing timing control to a means to introduce additional gain, each base is connected to said means of a bias circuitry influencing timing control, the sources of said pair of transistors are connected to each other and to a current source, and each drain of said transistors is connected to a means of a LC-tank, Furthermore said circuit comprises a means of a bias circuitry influencing timing control, a means to introduce additional gain in the amplification loop, a current mirror being connected to the sources of said second pair of transistors, a LC-tank being connected between the drains of said first pair of transistors, and a differential output comprising two ports being located at both sides of said LC-tank.

Also in accordance with the objectives of the invention a circuit for a voltage controlled oscillator being enabled for very low-power operations, having a low phase-noise, a timing control by a bias circuitry, a reduced power consumption, and a higher frequency stability has been achieved. Said circuit comprises a first pair of transistors being of a technology wherein complementary polarity transistors are available, wherein the base of a first transistor of said pair is connected to the drain of a second transistor of said pair and the base of a second transistor of said pair is connected to the drain of said first transistor of said pair of transistors, the sources of said transistors are connected to each other and to a $V_{dd}$ voltage, and the drain of a first transistor of said first pair of transistors is connected to the drain of a first transistor of a second pair of transistors and the drain of a second transistor of said first pair of transistors is connected to the drain of a second transistor of said second pair of transistors, a power supply supplying said Vdd voltage, a second pair of transistors being of a technology wherein complementary polarity transistors are available, wherein the base of a first transistor of said second pair is connected via a means of a bias circuitry influencing timing control to a means to introduce additional gain and the base of a second transistor of said pair is connected via said means of a bias circuitry influencing timing control to a means to introduce additional gain, each base is connected to said means of a bias circuitry influencing timing control, the sources of said pair of transistors are connected to each other and to a current source, and each drain of said transistors is connected to a means of a LC-tank. Furthermore said circuit comprises a means of a bias circuitry influencing timing control, a means to introduce additional gain in the amplification loop a means to actively discharge transistor channels, a current mirror being connected to the sources of said second pair of transistors, a LC-tank being connected between the drains of said first pair of transistors, and a differential output comprising two ports being located at both sides of said LC-tank.

Also in accordance with the objectives of the invention a circuit for a voltage controlled oscillator being enabled for very low current operations having a low phase-noise, a timing control by a bias circuitry, a reduced power consumption, a higher frequency stability, and an enlarged amplitude has been achieved. Said circuit comprises a first pair of transistors being of a technology, wherein complementary polarity transistors are available, wherein the base of a first transistor of said pair is connected to the drain of a second transistor of said pair and the base of a second transistor of said pair is connected to the drain of said first transistor of said pair of transistors, the sources of said transistors are connected to each other and to a $V_{dd}$ voltage, and the drain of a first transistor of said first pair of transistors is connected to the drain of a first transistor of a second pair of transistors and the drain of a second transistor of said first pair of transistors is connected to the drain of a second transistor of said second pair of transistors, a power supply supplying said $V_{dd}$ voltage, and a second pair of transistors being of a technology wherein complementary polarity transistors are available, wherein the base of a first transistor of said second pair is connected via a means of a bias circuitry influencing timing control to a means to introduce additional gain and the base of a second transistor of said pair is connected via said means of a bias circuitry influencing timing control to a means to introduce additional gain, each base is connected to said means of a bias circuitry influencing timing control, the sources of said pair of transistors are connected to each other and to a current source, and each drain of said transistors is connected to a means of a LC-tank. Furthermore said circuit comprises a means of a bias circuitry influencing timing control, a means to introduce additional gain in the amplification loop, a means to enlarge the amplitude of the oscillations, a current mirror being connected to the sources of said second pair of transistors, a LC-tank being connected between the drains of said first pair of transistors, and a differential output comprising two ports being located at both sides of said LC-tank.

Also in accordance with the objectives of the invention a circuit for a voltage controlled oscillator, being enabled for low current operation having minimal power consumption, a very low phase-noise, a timing control by a bias circuitry, a higher frequency stability, and an enlarged amplitude has been achieved. Said circuit comprises a first pair of transistors, being of a technology wherein complementary polarity transistors are available, wherein the base of a first transistor of said pair is connected to the drain of a second transistor of said pair and the base of a second transistor of said pair is connected to the drain of said first transistor of said pair of transistors, the sources of said transistors are connected to each other and to a $V_{dd}$ voltage, and the drain of a first transistor of said first pair of transistors is connected to the drain of a first transistor of a second pair of transistors and the drain of a second transistor of said first pair of transistors is connected to the drain of a second transistor of said second pair of transistors, a power supply supplying said $V_{dd}$ voltage, a second pair of transistors being of a technology, wherein complementary polarity transistors are available, wherein the base of a first transistor of said second pair is connected via a means of a bias circuitry influencing timing control to a means to introduce additional gain and the base of a second transistor of said pair is connected via said means of a bias circuitry influencing timing control to a means to introduce additional gain, each base is connected to said means of a bias circuitry influencing timing control, the sources of said pair of transistors are connected to each other and to a current source, and each drain of said transistors is connected to a means of a LC-tank. Furthermore said circuit comprises a means of a bias circuitry influencing timing control, a means to run buffer-inverters in class C mode, a means to enlarge the amplitude of the oscillations, a current mirror being connected to the sources of said second pair of transistors, a LC-tank being connected between the drains of said first pair of transistors, and a differential output comprising two ports being located at both sides of said LC-tank.

BRIEF DESCRIPTION OF THE DRAWINGS

In the accompanying drawings, forming a material part of this description, there is shown:

FIG. 1 prior art shows an VCO-1L having a N-MOS current mirror

FIG. 2 prior art shows an VCO-1L having a P-MOS current mirror

DESCRIPTION OF THE PREFERRED EMBODIMENTS

Disclosed are five different preferred embodiments of enhancements to prior art voltage controlled oscillators.

Figure 3:
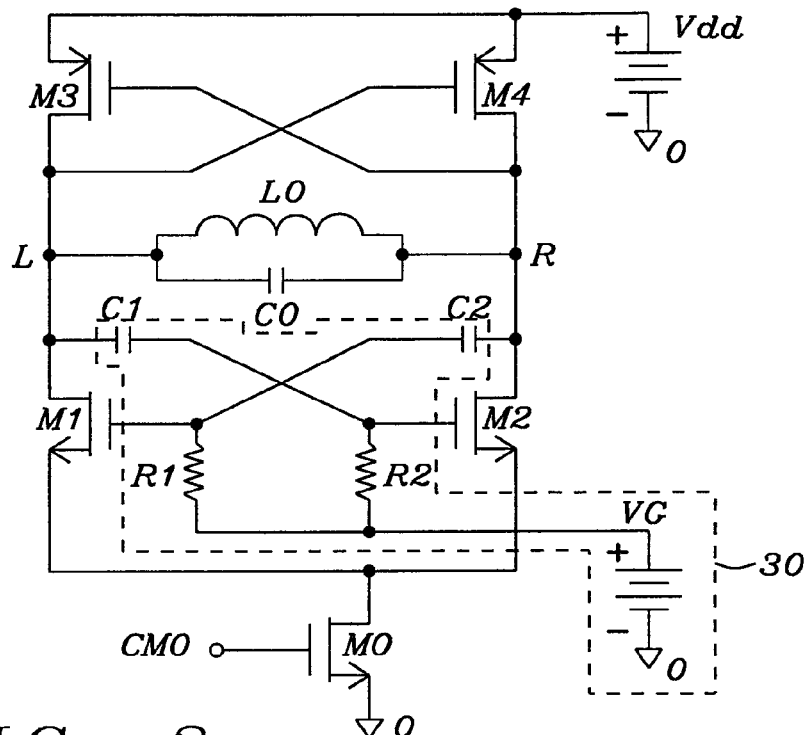
FIG. 3 shows a timing control by bias circuitry of a VCO

FIG. 3 shows a circuit according to the present invention based on the referred prior art circuit as shown in FIG. 1 prior art, characterized by means of an additional timing control 30. In the preferred embodiment shown in FIG. 3 said additional timing control is performed by capacitors C1 and C2, resistors R1 and R2 and a threshold voltage VG. The capacitors remove the DC connection gate-drain of the cross coupled transistors and provide thus the possibility to set time instances via the resistors when the transistors M1 and M2 will open and close. This depends of course from the threshold voltage typical for the specific transistor in use, denoted usually by $V_{th}$ or in case of bipolar transistors, this is the Shockley voltage, usually in the range of 0.6 to 0.9 Volts.

The rest of the structure of the circuit is without changes compared to the circuit shown in FIG. 1 prior art comprising an N-MOS current mirror CM0, a lower layer of the gain providing N-MOS structure M1 and M2, an upper level of a gain providing P-MOS structure M3 and M4 and an LC-tank comprising the inductor L0 and the capacitor C0.

There are more significant benefits for the circuit performance by the circuit invented. Introducing the capacitors C1 and C2 also decreases the leakage of energy from the parallel resonance tank Lo-Co. Thus the capacitors used in said circuit should be of high quality, usually metal-insulator-metal (MIM) capacitors. Both capacitors have the same capacitance. The capacitance of said capacitors is determined by the desired frequency of the signal and is thus decreasing the influence of low frequency noise from propagation in the amplifying loop of M1 and M2.

The resistors R1 and R2 should be low-noise resistors because the noise generated by them is amplified in the gain-loop. Their resistance should be high enough to prevent leakage of the energy of the LC-tank and low enough to generate not too much noise.

The value of the control voltage VG is set to provide the ability to shut-down the transistors as soon as the energy required to keep the oscillations in the LC tank is secured. This provides also the ability to decrease the overall noise injected from those transistors, especially the 1/f noise, which is not generated, when the transistors are not in a conducting current state. With reference to the quality factor of the tank, the shorter the time interval is while the transistors are open, the lower will be the injected noise, the lower will be the energy supplied to the LC-tank, and the higher will be the frequency stability of the circuit. All these positive characteristics can be achieved when the quality factor of the tank is high.

Thus, by introducing said bias circuitry the power consumption is reduced also and the circuit performance can be adjusted to the specifics of the silicon process used.

One of the properties of the circuit shown in FIG. 3 is that a especially higher gain of the transistors M1–M2 is not required provided the quality factor of the resonance tank L0-C0 is high enough. By reducing the gain the overall current consumption in the circuit can be decreased. On the other hand the gain needed at lower currents requires small in area transistors, which are having an higher 1/f noise.

Same applies for the upper layer transistors M3 and M4 as shown in FIG. 3. Higher 1/f noise causes higher frequency instability, therefore it is desirable to increase the size of the transistors, which further decreases their gain. Also at smaller currents the amplitude of the generated signal is barely sufficient to maintain the control over the timing, thus further contributing to reduced frequency stability.

Figure 4:
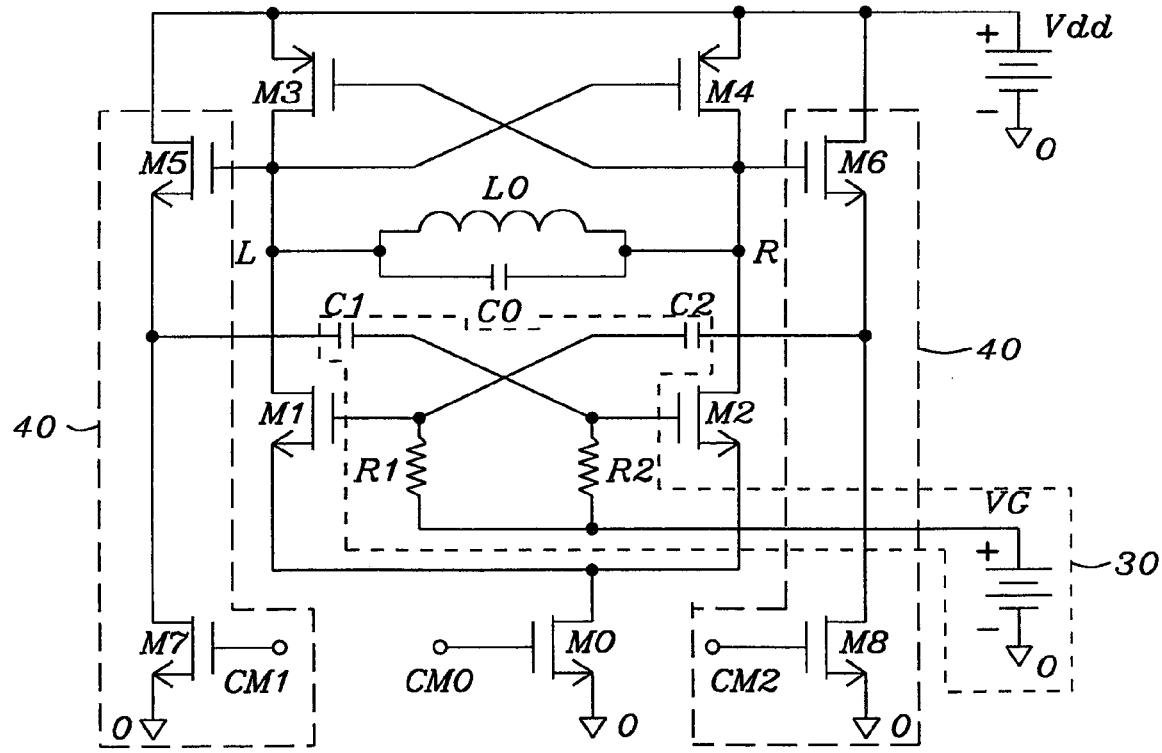
FIG. 4 illustrates an active pull down circuit linked to a VCO.

FIG. 4 shows a circuit according to the present invention introducing additional gain in the amplification loop and thus solving the inherent problems of the prior art circuits shown in FIG. 1 prior art, in FIG. 2 prior art and of the circuit invented shown in FIG. 3.

The number 40 signifies the means to introduce additional gain in the amplification loop. In the preferred embodiment shown in FIG. 4 said means comprises the transistors M5–M7 and as well M6–M8 forming source-follower type of buffers, i.e. current amplifiers. They inject the input current needed to re-charge the input capacitance of the main transistors M2 and M1 respectively, thus providing additional gain in the loop. Their current mirrors M7-based CM1 and M8-based CM2 provide the small power required to keep M5 and M6 working only for a small fraction of the time-period when the main transistors M1 and M2 are on. To operate properly it is sufficient to have those transistors M5 and M6 very small in geometry. Therefore, they do not affect the performance of the LC-tank being connected to it.

The additional gain from M5 and M6 helps making the current in the core via the current mirror CM01 smaller than in the original circuit shown in FIG. 3, thus decreasing the noise generated by this current mirror. At lower currents the transistors M5 and M6 still provide the gain needed to maintain the oscillations but load less the resonance tank L0-C0, which contributes further in frequency stability of the generated signal. And as additional benefit this architecture has potentially higher speed due to the smaller transistors in use, thus it can be used in broader and higher frequency range of applications.

Furthermore, the means 30 of additional timing control as shown in FIG. 3 has been used in the circuit of FIG. 4 as well.

Simulation runs demonstrate that the circuit shown in FIG. 4 has a significant higher stability of frequency as the circuit shown in FIG. 3 while the phase noise has the same order of magnitude in both circuits.

It is well known that for very low-power circuits the speed can be increased by actively pumping-out the charges of the channels of the MOS transistors by introducing additional complementary parallel conducting MOS transistors. This approach is classic for digital circuits and sampling circuits and it usually called transmission-gate.

Figure 5:
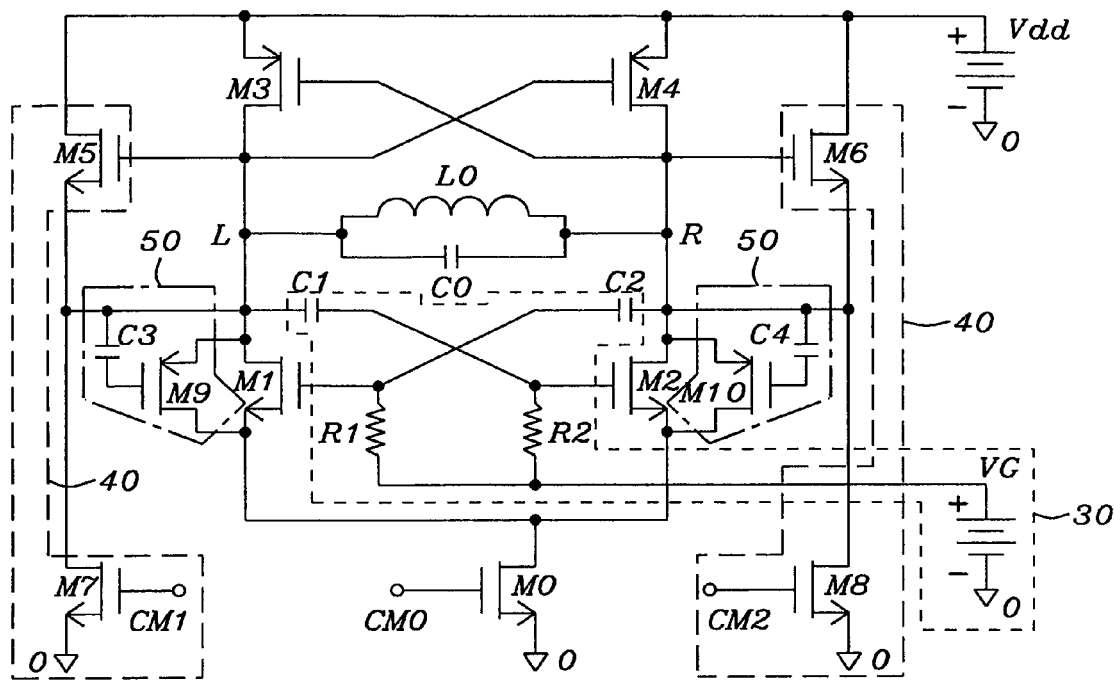
FIG. 5 shows a N-MOS channel discharge by P-MOS linked to a VCO

The circuit shown in FIG. 4 can be enhanced for enablement in very low-power operations in another embodiment of the present invention as shown in FIG. 5. Said enhancement is achieved by adding means 50 to actively discharge the transistor channels of the transistors M1 and M2 in order to increase the speed of said transistors. In a preferred embodiment of the invention said means are comprising complementary transistors M9 and M10 in parallel with main transistors M1 and M2 respectively and additionally a pair of capacitors C3 and C4.

Since the overall topology has a differential i.e. symmetrical structure, the signals for control the P-MOS transistors are immediately available and used as shown on FIG. 5. Adding those two transistors M9 and M10 has also the side benefits of improving the linearity of the switches M1 and M2 and further decreasing their serial resistance which contributes to decrease the requirements of the voltage power supply. Thus, the circuit shown in FIG. 5 as part of the present invention is very suitable for applications requiring a low current power supply and a very low power consumption while having still a high speed/frequency of operation.

Furthermore the circuit shown in FIG. 5 comprises the means of an additional timing control 30 as shown in FIG. 3, and said means to introduce additional gain in the amplification loop 40 as shown in FIG. 4.

The size of the transistors M9 and M10 is small and determined by the amount of accumulated charges in M1 and M2. Thus, the capacitances of M9 and M10 are not reducing the speed of the overall circuit.

Simulation runs to simulate the phase noise of the circuit shown in FIG. 5 demonstrate that the noise level, in spite of the low current operation, is still as good as the noise level achieved with the circuits shown in FIG. 3 and in FIG. 4.

The circuit shown in FIG. 5 can be further enhanced. In case, the upper layer transistors have to operate in higher current densities, then discharging N-MOS transistors can be connected in parallel to them and the differential control signals are taken in the same manner from the structure.

Figure 6:
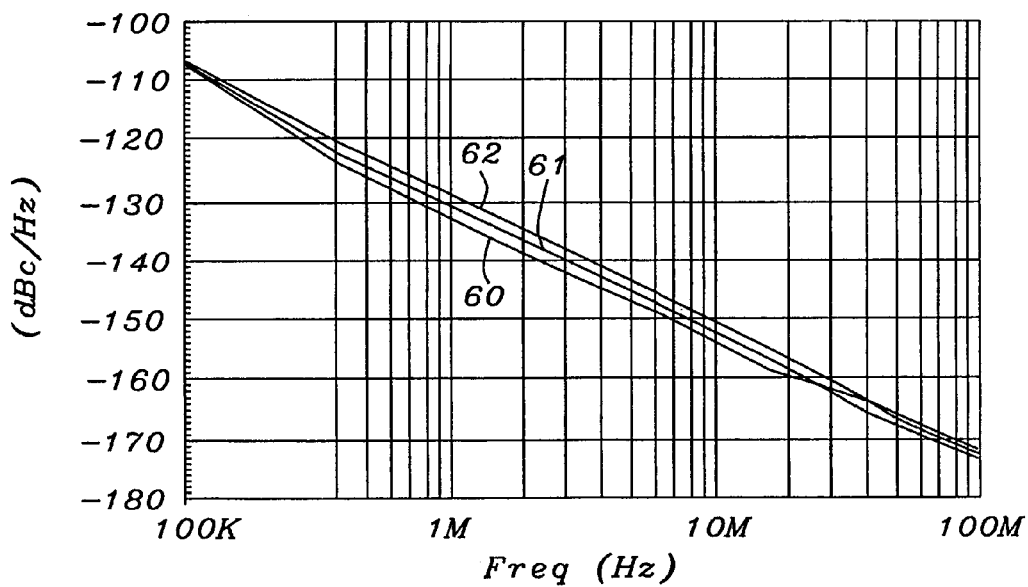
FIG. 6 illustrates phase-noise tradeoffs by separate current mirrors of a VCO

An important control feature of the circuit is the ability to control the current of the current mirrors CM1 and CM2 independently from the main current mirror CM0. This provides opportunity for different trade-off between stability performance and current consumption, as illustrated on FIG. 6, showing the phase-noise trade-offs by separate currents in the current mirrors. The horizontal coordinate shows the frequency in the range from 100 KHz to 100 MHz, the vertical coordinate shows the centre phase noise in the range between −180 dBc/Hz and −100 dBc/Hz. There are three curves having as parameters currents of the current mirrors CM1 and CM2. Curve 60 has got a current mirror in the magnitude of 0.5 mA, curve 61 has got a current mirror in the magnitude of 1 mA, and curve 62 has got a current mirror in the magnitude of 1.5 mA. The increase of the current through CM1 and CM2 in the circuit of FIG. 5, provides better performance at higher frequency offset, which is in fact the case needed mostly for GSM, DCS/PCS and W-CDMA mobile terminals/phones.

The need to create a topology operational with a power supply having a further reduced voltage and still preserving the phase-noise performance at a given quality factor of the L0-C0 tank and given current consumption, leads to the need of enlarging the amplitude of the oscillations of the VCO. The analysis of the previous structures shows that the limitation of the amplitude is caused by the limit imposed by the voltage between the gate and drain of the upper layer transistors M3 and M4, while this problem does not exist anymore after biasing circuitries have been introduced in lower layer transistors M1 and M2.

Figure 7:
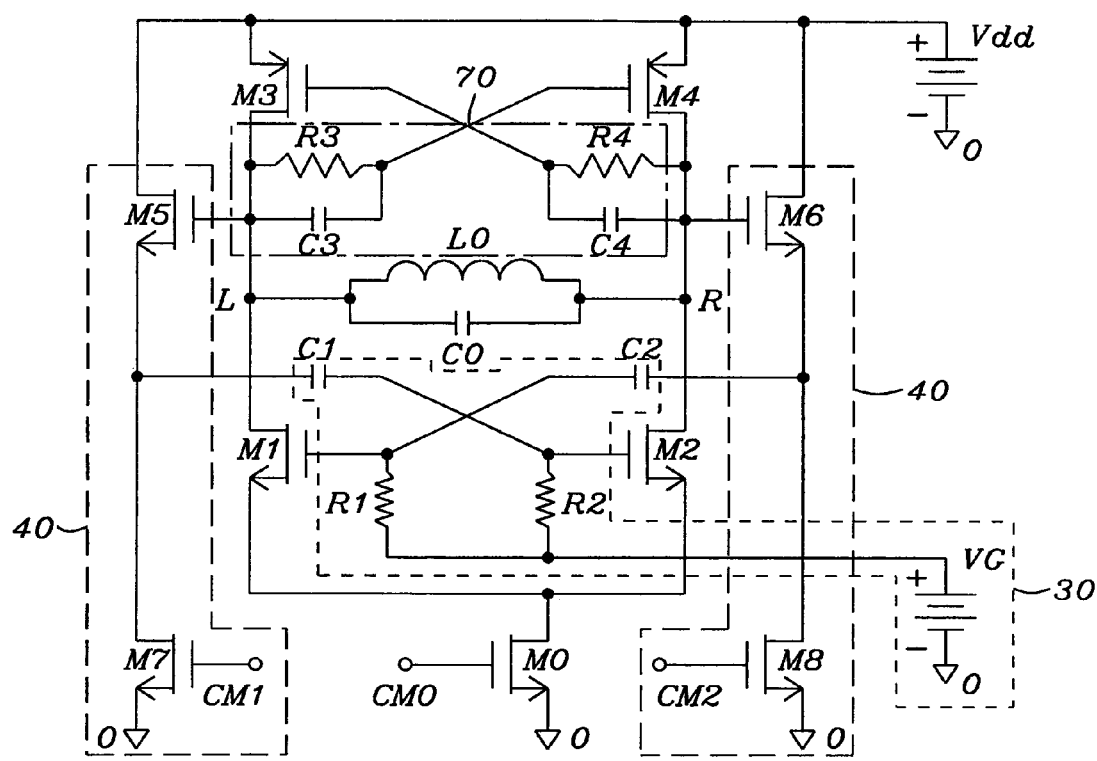
FIG. 7 illustrates a circuit of a VCO having an enlarged amplitude

FIG. 7 shows another embodiment of the present invention wherein the amplitude of the differential signal does not experience the limitation of the gate-drain voltage of the P-MOS transistors M3 and M4. The circuit of FIG. 7 comprises a means 70 to enlarge the amplitude of the oscillations. In a preferred embodiment of the present invention said means 70 to enlarge the amplitude of the oscillations comprises the resistors R3 and R4 and the capacitors C3 and C4. The resistors R3 and R4, added to the circuit shown in FIG. 7, release the gain from the direct control of the voltage over the L0-C0 tank, or in another words, enables the voltage over the tank to be more independent from the limiting influence of the gate-drain voltage of the P-MOS transistors M3 and M4.

In order to keep the regeneration process still active, i.e. the gain loop high enough to keep the oscillations going, small capacitors C3 and C4, sustaining the oscillations, are added to the circuit shown in FIG. 7 located parallel to the resistors R3 and R4. Since they are parallel to the resonance tank too, they have to be high quality factor capacitors, similar to type of C1 and C2. Those capacitors, sustaining the oscillations, would not be enough to keep the circuit operational if the additional gain of the buffers M5 and M6 was not introduced in the circuit. The resulting amplitude of the circuit shown in FIG. 7 is about twice as high as the amplitude of the circuits shown in FIGS. 3, 4 and 5. Additionally and in fact as the primary objective the phase noise performance is absolutely better compared to the circuits shown in FIGS. 3, 4 and 5.

Furthermore the circuit shown in FIG. 7 comprises the means of an additional timing control 30 as shown in FIG. 3, and said means to introduce additional gain in the amplification loop 40 as shown in FIG. 4.

Additionally the circuit shown in FIG. 7 offers much more flexibility to the designer of the circuit. The upper layer of the circuit shown in FIG. 4, comprising the transistors M3 and M4, and the lower layer of the circuit, comprising the transistors M1 and M2, can be designed independently to establish the gain required in the two loops.

Figure 8:
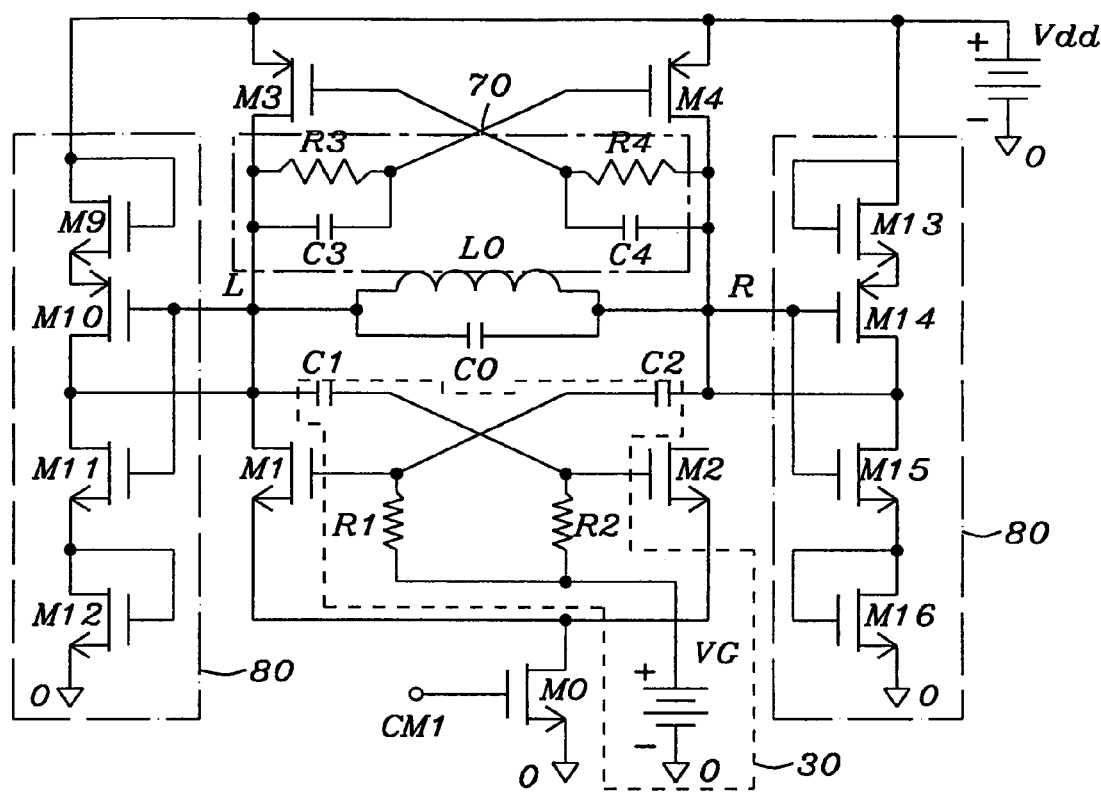
FIG. 8 shows a circuit of a VCO having CMOS inverters instead of buffers

The requirement to decrease still further the power consumption and still to preserve the performance of the circuit topology leads to the use of means 80 to run buffer-inverter in class-C mode. A preferred embodiment of the present invention is shown in FIG. 8. C-MOS inverters-buffers are used in the gain loop. Said means 80 to run buffer-inverter in class-C mode comprises the transistors M9 to M16 in a preferred embodiment of the invention.

The signals from the L0-C0 tank are amplified and inverted by two pairs of CMOS transistors M10/M11 and M14/M15, while transistors M9, M12, M13 and M16 serve as current biasing components. By said transistors M9, M12, M13 and M16 it is possible to tune the CMOS buffers-inverters to work in deep class-C mode, which is energy saving and is a low-noise circuitry by nature, thus a better performance of the circuit topology is achieved. Class-C mode is a mode of operation of transistor amplifier which is characterized by only a small portion of the input signal is present in the output signal. Since the transistor does not conduct except during a small portion of the input signal, this is the most efficient amplifier. Since there is already inversion on the way due to the CMOS pairs, the output of each buffer is applied to the corresponding transistors in the nearest branch.

Furthermore, there is no need of current mirrors to control the current through the buffers, it is done automatically done having an adequate design of the bias transistors M9, M12, M13 and M16. The higher output amplitude achieved by the circuit shown in FIG. 8 is also important when the VCO is to be used in transmitter circuitries wherein higher output power is required, for example in GSM, PCS/DCS, W-CDMA etc. applications.

Furthermore the circuit shown in FIG. 8 comprises the means of an additional timing control 30 as shown in FIG. 3, and said means to enlarge the amplitude of the oscillations 70 as shown in FIG. 7.

Figure 9:
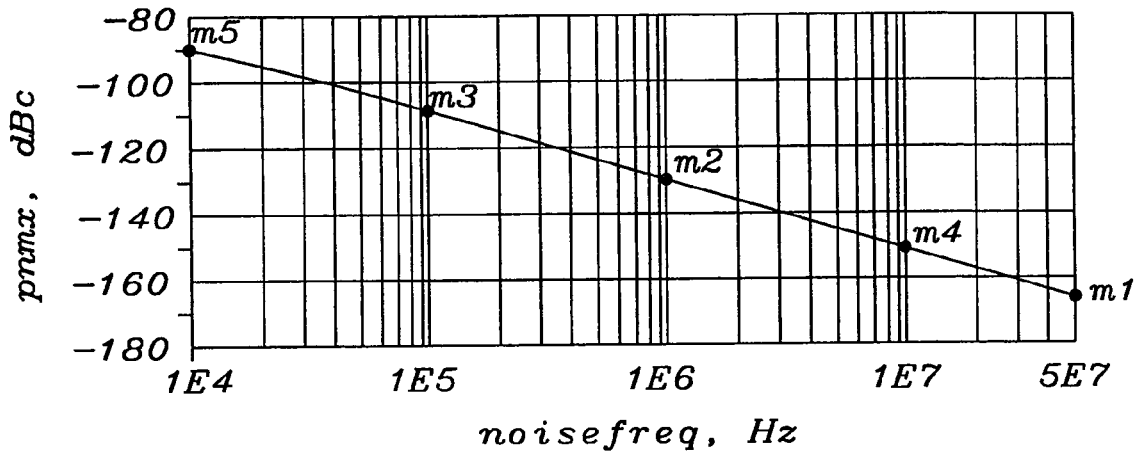
FIG. 9 illustrates a performance verification of the circuit using CMOS inverters

FIG. 9 shows simulation results of the circuit shown in FIG. 8. The horizontal coordinate shows the offset from the oscillating frequency, which is from 10 KHz to 50 MHz, the vertical coordinate shows the centre phase noise in the range between −180 dBc/Hz and −80 dBc/Hz. The centre phase noise in the five operating points m1 to m5 ranges between −164.6 dBc in the operating point m1, having an offset of 50 Mhz, to −92.25 dBc in the operating point m5, having an offset of 10 Khz. It has to be noted that the amplitudes at the buffer input and output are very high.

While the invention has been particularly shown and described with reference to the preferred embodiments thereof, it will be understood by those skilled in the art that various changes in form and details may be made without departing from the spirit and scope of the invention.

What is claimed is:

1. A method to achieve low power consumption, high output amplitude and a high frequency stability for a voltage-controlled oscillator is comprising:
   provide a current mirror, a power supply voltage Vdd, two single-ended outputs, a lower layer of gain providing structure comprising cross-coupled transistors, an upper layer of gain providing structure, and an LC-tank;
   set the time instances when said transistors of lower layer of gain providing structure open and close; and shut-down said transistors of lower layer of gain providing structure as soon as the energy required to keep the oscillations in said LC-tank is secured.

2. The method of claim 1 wherein said setting of time instances is performed by blocking a DC-connection of gate to drain of said cross-coupled transistors and by a pair of resistors wherein each resistor is coupled between the gate of one of each said cross-coupled transistors and a control voltage.

3. The method of claim 2 wherein said blocking of a DC-connection is performed by two capacitors wherein a first capacitor is located between the gate of a first transistor of said cross-coupled transistors and the drain of a second of said cross-coupled transistors and a second capacitor is located between the gate of a second transistor of said cross-coupled transistors and the drain of a first of said cross-coupled transistors.

4. The method of claim 1 wherein said shut-down said transistors of said lower layer of gain providing structure is set by the value of a control voltage.

5. A method to achieve low power consumption, high output amplitude and an improved high frequency stability for a voltage-controlled oscillator is comprising:
   provide a current mirror, a power supply voltage Vdd, two single-ended outputs, a lower layer of gain providing structure comprising cross-coupled transistors, an upper layer of gain providing structure, a control voltage, a pair of capacitors to block a DC-connection to the gates of said cross-coupled transistors, a pair of resistors, and an LC-tank;
   set the time instances when said transistors of lower layer of gain providing structure open and close;
   shut-down said transistors of lower layer of gain providing structure as soon as the energy required to keep the oscillations in said LC-tank is secured; and
   add additional gain in the amplification loop.

6. The method of claim 5 wherein said setting of time instances is performed by blocking a DC-connection of gate to drain of said cross-coupled transistors and by a pair of resistors wherein each resistor is coupled between the gate of one of each said cross-coupled transistors and a control voltage.

7. The method of claim 6 wherein said blocking of a DC-connection is performed by two capacitors wherein a first capacitor is located between the gate of a first transistor of said cross-coupled transistors and the drain of a second of said cross-coupled transistors and a second capacitor is located between the gate of a second transistor of said cross-coupled transistors and the drain of a first of said cross-coupled transistors.

8. The method of claim 5 wherein said shut-down said transistors of said lower layer of gain providing structure is set by the value of a control voltage.

9. The method of claim 5 wherein said addition of additional gain is performed by source-follower type of buffers, injecting input current required to recharge the input capacitance of said lower layer of gain providing structure.

10. The method of claim 9 wherein means are provided to ensure that said source-follower type of buffers are only on when said lower layer of gain providing structure is on.

11. The method of claim 10 wherein said means to ensure that said source-follower type of buffers are only on when said lower layer of gain providing structure is on are current mirrors.

12. A method to achieve low power consumption, high output amplitude and an improved high frequency stability, and high speed for a voltage-controlled oscillator is comprising:
   provide a current mirror, a power supply voltage Vdd, two single-ended outputs, a lower layer of gain providing structure comprising cross-coupled transistors, an upper layer of gain providing structure, a control voltage, a pair of capacitors to block a DC-connection to the gates of said cross-coupled transistors, a pair of resistors, and an LC-tank;
   set the time instances when said transistors of lower layer of gain providing structure open and close;
   shut-down said transistors of lower layer of gain providing structure as soon as the energy required to keep the oscillations in said LC-tank is secured;
   add additional gain in the amplification loop; and
   pump-out charges of the channels of said transistors of said lower layer gain providing structure.

13. The method of claim 12 wherein said setting of time instances is performed by blocking a DC-connection of gate to drain of said cross-coupled transistors and by a pair of resistors wherein each resistor is coupled between the gate of one of each said cross-coupled transistors and a control voltage.

14. The method of claim 13 wherein said blocking of a DC-connection is performed by two capacitors wherein a first capacitor is located between the gate of a first transistor of said cross-coupled transistors and the drain of a second of said cross-coupled transistors and a second capacitor is located between the gate of a second transistor of said cross-coupled transistors and the drain of a first of said cross-coupled transistors.

15. The method of claim 12 wherein said shut-down said transistors of said lower layer of gain providing structure is set by the value of a control voltage.

16. The method of claim 12 wherein said addition of additional gain is performed by source-follower type of buffers, injecting input current required to recharge the input capacitance of said lower layer of gain providing structure.

17. The method of claim 16 wherein means are provided to ensure that said source-follower type of buffers are only on when said lower layer of gain providing structure is on.

18. The method of claim 17 wherein said means to ensure that said source-follower type of buffers are only on when said lower layer of gain providing structure is on are current mirrors.

19. The method of claim 12 wherein said pumping-out charges is performed by introducing parallel complementary transistors in parallel to said transistors of said lower layer of gain providing structure.

* * * * *